United States Patent
Chen et al.

(10) Patent No.: US 7,234,124 B2
(45) Date of Patent: Jun. 19, 2007

(54) METHOD AND APPARATUS FOR PERFORMING POWER ROUTING ON A VOLTAGE ISLAND WITHIN AN INTEGRATED CIRCUIT CHIP

(75) Inventors: Bing Chen, Wappingers Falls, NY (US); Scott W. Gould, South Burlington, VT (US); Mark Kwang-Jen Hsu, Fishkill, NY (US); Patrick M. Ryan, Essex Junction, VT (US); Erich C. Schanzenbach, Dover Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 10/980,575

(22) Filed: Nov. 3, 2004

(65) Prior Publication Data

US 2005/0120322 A1 Jun. 2, 2005

Related U.S. Application Data

(62) Division of application No. 10/605,569, filed on Oct. 9, 2003, now Pat. No. 6,861,753.

(51) Int. Cl.
*G06F 17/50* (2006.01)
*H01L 23/52* (2006.01)
*H01L 29/40* (2006.01)

(52) U.S. Cl. .................. 716/13; 716/12; 716/14; 257/691; 257/786

(58) Field of Classification Search ............... 174/2, 174/4, 5, 7, 10, 12, 13, 255; 257/202, 211, 257/500, 691, 758; 326/101; 324/771
See application file for complete search history.

(56) References Cited

U.S. PATENT DOCUMENTS

| | | | |
|---|---|---|---|
| 6,493,859 B1 * | 12/2002 | Gould et al. ................. | 716/12 |
| 6,523,150 B1 * | 2/2003 | Buffet et al. ................. | 716/4 |
| 6,538,314 B1 * | 3/2003 | Buffet et al. ................. | 257/691 |
| 6,598,206 B2 * | 7/2003 | Darden et al. ................ | 716/2 |
| 6,779,163 B2 * | 8/2004 | Bednar et al. ................ | 716/7 |
| 6,792,582 B1 * | 9/2004 | Cohn et al. ................... | 716/7 |
| 2004/0243958 A1 * | 12/2004 | Bednar et al. ................ | 716/7 |

OTHER PUBLICATIONS

NA78044378, "Flexible voltage distribution in custom semiconductor circuit chips" Apr. 1978, IBM Technical disclosure bulletin, vol. No. 20, Issue No. 11A, p. No. 4378-4379.*

(Continued)

*Primary Examiner*—Jack Chiang
*Assistant Examiner*—Helen Rossoshek
(74) *Attorney, Agent, or Firm*—Richard M. Kotulak; Dillon & Yudell LLP

(57) ABSTRACT

A method for performing power routing on a voltage island within an integrated circuit chip is disclosed. A first power grid is generated for a voltage island on metal levels 1 to N−1. Then, a second power grid is generated on metal levels N and above. A bounding region of the second robust power grid is determined. Finally, the shortest distance connections from a set of power sources is routed to the second power grid.

6 Claims, 4 Drawing Sheets

OTHER PUBLICATIONS

Zlydina et al., "3D power grid modeling", Dec. 13-15, 2004, Electronics, Circuits and Systems, 2004. ICECS 2004. Proceedings of the 2004 11th IEEE International Conference on, pp. 129-132, Digital Object Identifier 10.1109/ICECS.2004.1399631☐☐.*

Kozhaya et al., "An electrically robust method for placing power gating switches in voltage islands", Oct. 3-6, 2004, Custom Integrated Circuits Conference, .Proceedings of the IEEE, pp. 321-324☐☐.*

* cited by examiner

METHOD AND APPARATUS FOR PERFORMING POWER ROUTING ON A VOLTAGE ISLAND WITHIN AN INTEGRATED CIRCUIT CHIP

This is a Division of application Ser. No. 10/605,569, filed Oct. 9, 2003 now U.S. Pat. No. 6,861,753.

BACKGROUND OF INVENTION

1. Technical Field

The present invention relates to integrated circuit designs in general, and, in particular, to a method and apparatus for distributing power in an integrated circuit having voltage islands. Still more particularly, the present invention relates to a method and apparatus for performing power routing on a voltage island within an integrated circuit chip.

2. Description of the Related Art

The concept of voltage islands is introduced into integrated circuit designs in order to integrate multiple design technologies on a same integrated circuit chip with increased performance and lower power consumption. The voltage island concept allows for one or more portions (islands) of an integrated circuit chip to be powered by both a chip-wide power source ($VDD_g$) and other voltage island power sources ($VDD_i$–$VDD_n$). $VDD_g$ and $VDD_i$–$VDD_n$ can be switched on and off in accordance with the operational demands of the integrated circuit. Typically, $VDD_g$ and $VDD_i$–$VDD_n$ (as well as GND) are supplied to a voltage island from separate chip-wide power sources.

Generally speaking, a voltage island requires an isolated power supply grid structure from the remaining portion of a chip power grid. In order to generate an electrically robust power grid structure for voltage islands that do not contain electromagnetic or IR drop violations, off-chip and on-chip power supply sources need to be routed accordingly. Typically, off-chip power supply sources for voltage islands originate at either C4 ball grid array locations or wirebond locations, and on-chip power supply sources for voltage islands originate at voltage regulator macro pins.

There are many problems that need to be overcome in order to have efficient power connections from $VDD_g$, $VDD_i$–$VDD_n$ and GND to a voltage island. The problems that need to be overcome include how not to require an overabundance of power wires to anticipate the power needs of unplaced voltage islands, how not to restrict placement of power service terminals contained within the voltage island circuits because of a locally sparse power grid, how to avoid electromigration and IR drop violations and how to avoid blocked pins and other wireability issues.

The present disclosure provides an improved method for performing power routing on a voltage island within an integrated circuit chip.

SUMMARY OF INVENTION

In accordance with a preferred embodiment of the present invention, a first power grid is generated for a voltage island on metal levels 1 to N−1. Then, a second power grid is generated on metal levels N and above. A bounding region of the second robust power grid is determined. Finally, the shortest distance connections from a set of power sources is routed to the second power grid.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
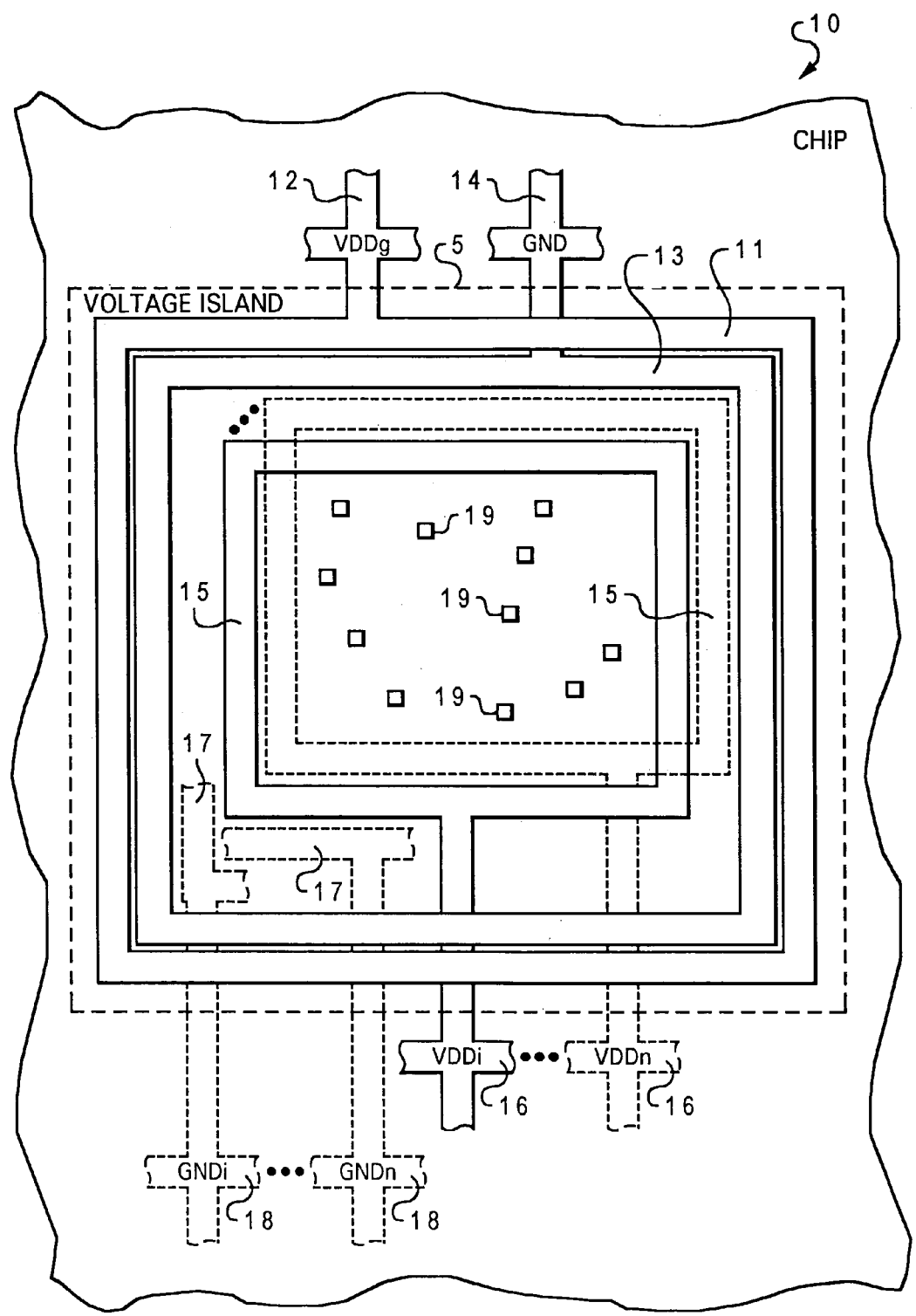
FIG. 1 is a diagram of an integrated circuit chip having a voltage island on which a preferred embodiment of the present invention can be implemented.

Referring now to the drawings and in particular to FIG. 1, there is depicted a diagram of an integrated circuit chip having a voltage island on which a preferred embodiment of the present invention can be implemented. As shown, an integrated circuit chip 10 includes a voltage island 5. Voltage island 5 includes a $VDD_g$ power network 11 supplied from a chip $VDD_g$ power grid 12, a GND power network 13 supplied from a chip GND power grid 14, $VDD_i$–$VDD_n$ power networks 15 supplied from on-chip $VDD_i$–$VDD_n$ power grids 16 and (optionally) $GND_i$–$GND_n$ power networks 17 supplied from on-chip $GND_i$–$GND_n$ power grids 18. Voltage island 5 also includes power service terminals (PSTs) 19 for supplying power to circuits and devices contained in voltage island 5. PSTs 19 must be connected to $VDD_g$, $VDD_i$–$VDD_n$ and GND.

Although $VDD_g$ power network 11, GND power network 13 and $VDD_i$–$VDD_n$ power networks 15 are shown as power rings in FIG. 1, it is understood by those skilled in the art that other types of configurations, such as grids, is also possible as well.

Figure 2:
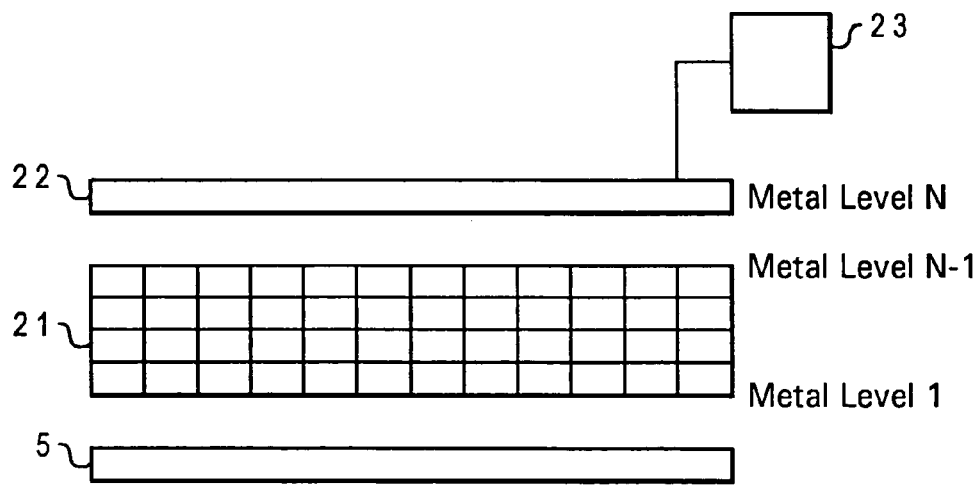
FIG. 2 is a cross-sectional diagram of the integrated circuit chip from FIG. 1, in accordance with a preferred embodiment of the present invention.

With reference now to FIG. 2, there is depicted a cross-sectional diagram of integrated circuit chip 10 from FIG. 1, in accordance with a preferred embodiment of the present invention. As shown, the power grids for voltage island 5 are preferably divided into two groups, namely, a first power grid 21 located from metal level 1 to metal level N−1 and a second power grid 22 located at metal level N and above. Alternatively, second power grid 22 can be in the form of a power segment. A power segment is defined as a power grid having only one level of metal lines. The relevant inputs and preconditions for second power grid 22 are:

1. power grid source points (such as a ball grid array pad, voltage regulator pins, and/or a wirebond pad 23 as shown in FIG. 2); and 2. voltage island of a defined size requiring a power grid up to a specific metal level.

Figure 3:
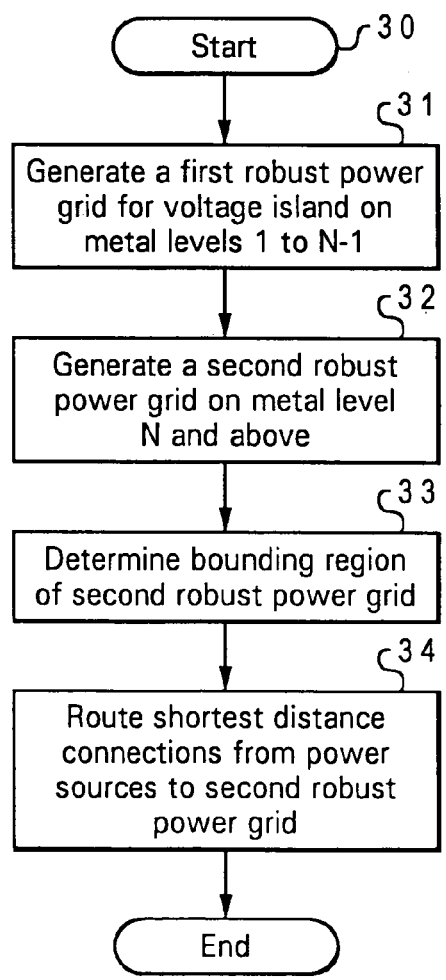
FIG. 3 is a high-level logic flow diagram of a method for performing power routing on a voltage island within an integrated circuit chip, in accordance with a preferred embodiment of the present invention.

Referring now to FIG. 3, there is illustrated a high-level logic flow diagram of a method for performing power routing on a voltage island within an integrated circuit chip, in accordance with a preferred embodiment of the present invention. Starting at block 30, a first power grid for a voltage island is generated on metal level 1 to metal level N−1, as shown in block 31. The robust power grid generation is preferably performed using techniques similar to the chip power grid generation. Then, a second power grid for voltage island is generated on metal levels N and above, as depicted in block 32. As mentioned above, the second power grid can be in the form of a power segment (i.e., having only one metal layer). The number of power segments (S) to be routed on metal levels N and above is preferably determined by the product of the number of power sources and the number of connections to be made per power source. Each power source may be connected to the voltage island using multiple wires rather than a single wide wire. The width of the multiple wires can be adjusted in order to meet all electrical constraints.

Next, the bounding region of the second power grid is determined, as shown in block 33. If the second power grid is formed of power segments, then all the power segments (S) are routed on metal level N so that a robust second power grid is formed across the bounding region and the full length of the bounding region can be extended. Subsequently, a set of shortest distance connections are routed from various power sources to the second power grid (or to respective power segments on metal layer N), as depicted in block 34. The router builds an array having entries with start/end shapes for each connection. Such array is sorted by distance so that a router can guarantee the shortest distance connections from a power source to a specific power segment on metal level N.

The steps within block 32 of FIG. 3 can be further expanded as follows:

1. obtain a numeric count of power source shapes (of the same voltage polarity) on the chip;
2. identify the chip position at which the voltage island is located;
3. calculate and generate a bounding region on top of the voltage island within which routing is to be performed; and
4. generate power grids within the bounding region.

The step within block 33 of FIG. 3 further includes the association of a keyword with a power source, and the voltage island identifies which power source should connect to the correct set of power grids on top of the voltage island, under multiple voltage island instances scenario.

The steps within block 34 of FIG. 3 can be further expanded as follows:

for each voltage $VDD_i$, do {
get source points into a group known as group_A;
divide group_A based on the connection per source information;
get the target power shapes (the second robust power grid on metal level N and above) to build a group_B;

```
for a given shape s in group_A, do {
  call ShapeRouter to route from s to a shape t in group_B
}
}
```

Figure 4:
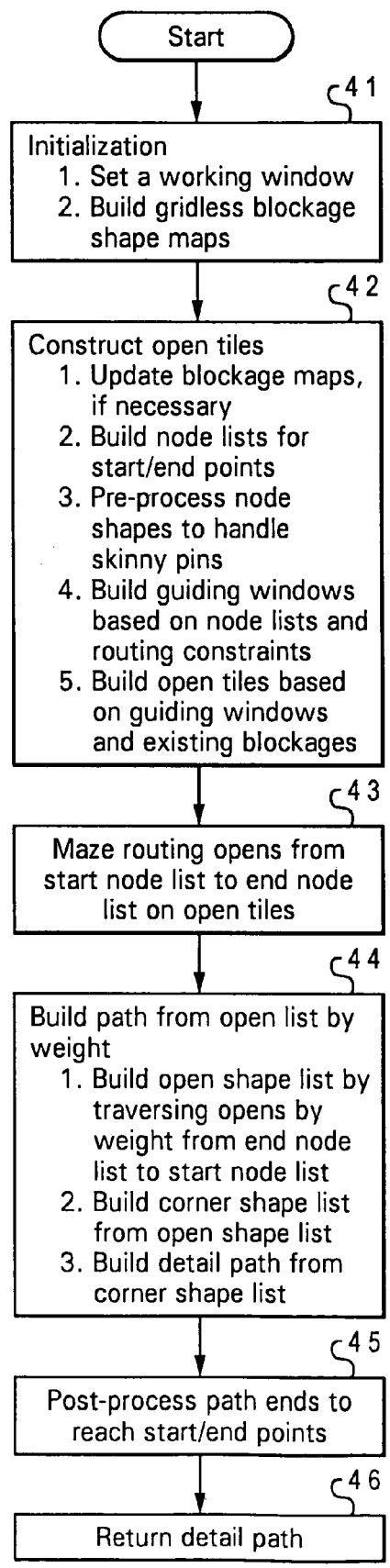
FIG. 4 is a high-level logic flow diagram of a ShapeRouter routine, in accordance with a preferred embodiment of the present invention.

With reference now to FIG. 4, there is depicted a high-level logic flow diagram of a ShapeRouter routine, in accordance with a preferred embodiment of the present invention. Basically, a shape router for performing the ShapeRouter routine is a point-to-point routing engine. First, an initialization procedure is performed, as shown in block 41. During initialization, a working window is set, and gridless blockage shape maps are built.

Then, open tiles are constructed, as depicted in block 42. During open tiles construction, blockage maps are updated, if necessary. Then, node lists for start and end points are built. Next, node shapes are pre-processed to handle "skinny" pins. Guiding windows are built based on node lists and constraints. Subsequently, open-tiles are built based on guiding windows and existing blockages.

Maze routing opens from start node list to end node list, as shown in block 43. A path is built from the open list by weight, as depicted in block 44. First, an open shape list is built by traversing opens by weight from end node list to start node list. Then, a corner shape list is built from the open shape list. Next, a detail path is built from the corner shape list.

Path ends are processed to reach start and end points, as shown in block 45. The process then returns detail path, as depicted in block 46.

As has been described, the present invention provides a method and apparatus for performing power routing on a voltage island within an integrated circuit chip. With the present invention, power can be routed to voltage islands from either off-chip power sources (wirebond pads) or on-chip power sources (voltage regulator macro pins) to voltage island grids directly above the voltage islands. Also, unique routes can be generated from power source to metal level segments over a voltage island with no intersecting or overlapping. Although the present invention describes power routing for on-chip drivers, it is understood by those skilled in the art that the present invention is also applicable to power routing from an off-chip driver circuit that requires off-chip power source.

Figure 5:
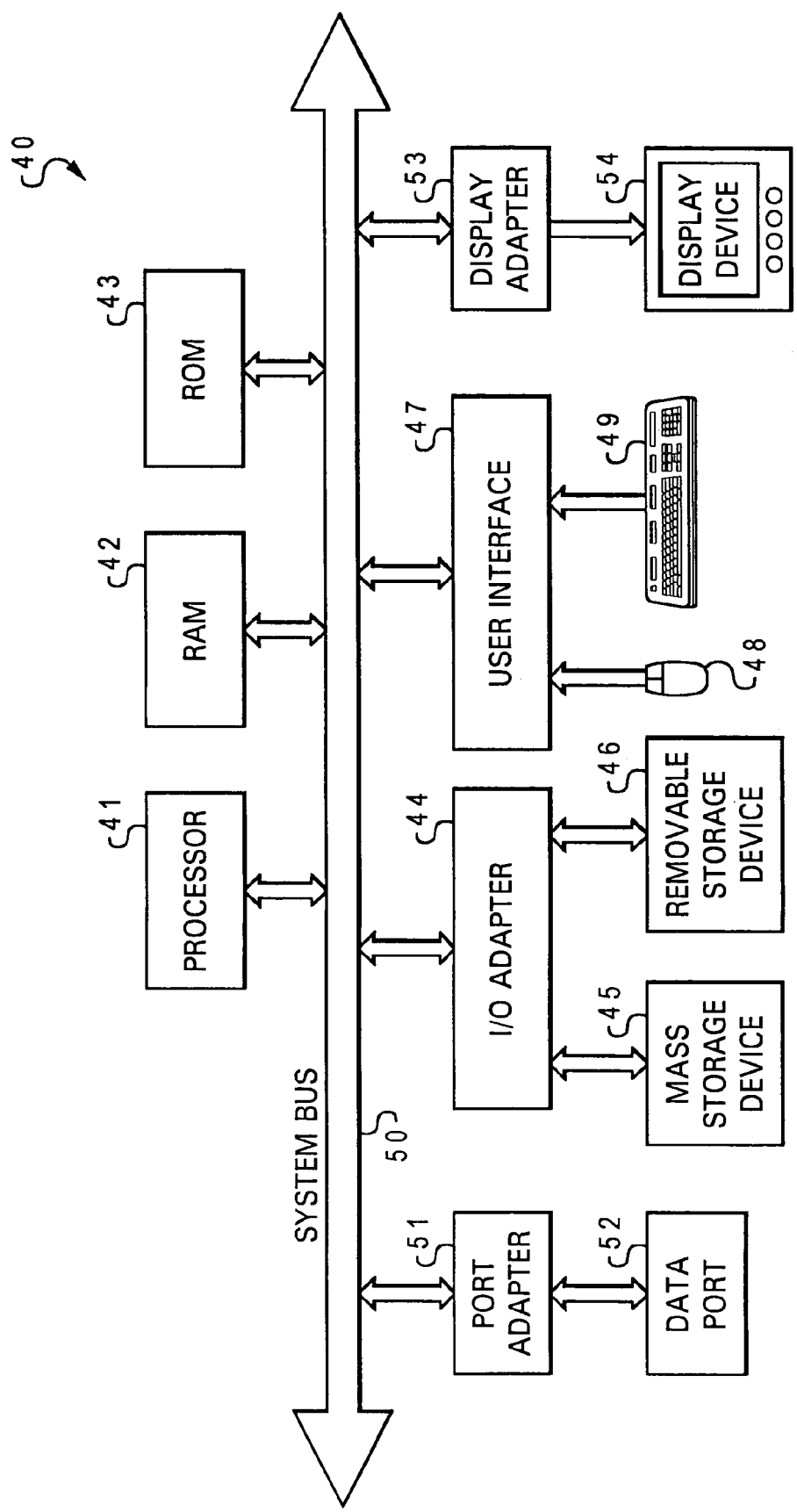
FIG. 5 is a block diagram of a data processing system for performing power routing on a voltage island within an integrated circuit chip, in accordance with a preferred embodiment of the present invention.

Generally, the method described herein is practiced with a general-purpose computer and the method may be coded as a set of instructions on removable or hard media for use by a general-purpose computer. Referring now to FIG. 5, there is depicted a block diagram of a general-purpose computer for performing power routing on a voltage island within an integrated circuit chip, in accordance with a preferred embodiment of the present invention. As shown, a computer system 40 includes a processor 41 interconnected to a random access memory (RAM) 42, a read-only memory (ROM) 43 via a system bus 50. Processor 41 is also interconnected to an input/output (I/O) adapter 44 for a connecting a removable storage device 46 and a mass storage device 45, a user interface adapter 47 for connecting a keyboard 49 and a mouse 48, a port adapter 51 for connecting a data port 52, and a display adapter 53 for connecting a display device 54.

ROM 43 contains the basic operating system for computer system 40. Examples of removable storage device 46 include floppy drives, tape drives and CD ROM drives. Examples of mass storage device 45 include hard disk drives and non-volatile memory such as flash memory. In addition to keyboard 49 and mouse 48, other user input devices such as trackballs, writing tablets, pressure pads, microphones, light pens and position-sensing screen displays may also be connected to user interface 47. Examples of display devices include cathode-ray tubes (CRTs) and liquid crystal displays (LCDs).

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

The invention claimed is:

1. A method for performing power routing on a voltage island within an integrated circuit chip, said method comprising:
   generating a first robust power grid for a voltage island on metal levels 1 to N−1;
   generating a second robust power grid for said voltage island on metal levels N and above; and
   routing a plurality of shortest distance connections from a plurality of power sources to said second robust power grid.

2. The method of claim 1, wherein said second robust power grid is a power segment.

3. The method of claim 1, wherein a number of power segments to be generated on said metal level N and above is determined by determining the product of a number of said power sources and a number of connections to be made per power source.

4. The method of claim 1, wherein said method further includes determining a bounding region of said second robust power grid.

5. The method of claim 1, wherein said generating a second robust power grid further includes:
   obtaining a count of power source shapes of an identical voltage polarity on a chip;
   identifying a chip position at which said voltage island is located;
   determining and generating a bounding region on top of said voltage island on which said routing is to be performed; and
   generating power grids within said bounding region.

6. The method of claim 1, wherein said routing further includes:
   obtaining a plurality of source points to form an group_A;
   dividing said group_A based on connection per source information;
   obtaining target power shapes for said second robust power grid on metal level N and above to build a group_B; and
   for a given middle shape s in said group_A, performing ShapeRouting to route from s to a shape t within in said group_B.

* * * * *